United States Patent
Kobayashi

(10) Patent No.: US 7,309,874 B2
(45) Date of Patent: Dec. 18, 2007

(54) FIELD-EFFECT TRANSISTOR

(75) Inventor: Nobuo Kobayashi, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/535,403

(22) PCT Filed: Jun. 18, 2004

(86) PCT No.: PCT/JP2004/008602

§ 371 (c)(1),
(2), (4) Date: May 18, 2005

(87) PCT Pub. No.: WO2004/114414

PCT Pub. Date: Dec. 29, 2004

(65) Prior Publication Data

US 2006/0049395 A1    Mar. 9, 2006

(30) Foreign Application Priority Data

Jun. 23, 2003    (JP)    ............................ 2003-178461

(51) Int. Cl.
*H01L 51/00*    (2006.01)
(52) U.S. Cl. ................. 257/40; 257/E51.027
(58) Field of Classification Search .................. 257/40
See application file for complete search history.

(56) References Cited

U.S. PATENT DOCUMENTS

| | | | | |
|---|---|---|---|---|
| 5,355,235 | A * | 10/1994 | Nishizawa et al. ........... 349/43 |
| 5,705,826 | A * | 1/1998 | Aratani et al. ................. 257/40 |
| 6,017,801 | A * | 1/2000 | Youn ........................... 438/296 |
| 6,048,756 | A * | 4/2000 | Lee et al. .................... 438/151 |
| 6,064,090 | A * | 5/2000 | Miyamoto et al. .......... 257/347 |
| 6,433,359 | B1 * | 8/2002 | Kelley et al. ................. 257/40 |
| 6,946,676 | B2 * | 9/2005 | Kelley et al. ................. 257/40 |
| 6,963,080 | B2 * | 11/2005 | Afzali-Ardakani et al. ... 257/40 |
| 2003/0102471 | A1 * | 6/2003 | Kelley et al. ................. 257/40 |
| 2004/0222412 | A1 * | 11/2004 | Bai et al. ...................... 257/40 |
| 2004/0222463 | A1 * | 11/2004 | Yeo et al. .................... 257/347 |

FOREIGN PATENT DOCUMENTS

| | | |
|---|---|---|
| JP | A 08-191162 | 7/1996 |
| JP | B2 2984370 | 9/1999 |
| WO | WO 92/01313 | 1/1992 |

OTHER PUBLICATIONS

Akiharu Iwatsuki et al., "2, 5-dimethylene-2, 5-dihydrothiophenel Yudotai no Gosei to Jugo", Journal of the Chemical Society of Japan, vol. 3, 1992, pp. 335-340, with translation.

* cited by examiner

*Primary Examiner*—Sue A. Purvis
*Assistant Examiner*—Eduardo A. Rodela
(74) *Attorney, Agent, or Firm*—Oliff & Berridge, PLC

(57) ABSTRACT

An organic FET 1 comprises a substrate 2 on which a gate insulation film 41 and a functional layer 43 are formed in this order, and a source electrode 6 and a drain electrode 8 are further arranged thereon at a predetermined distance from each other, and furthermore, an organic semiconductor layer 10 is formed on and between the electrodes 6 and 8. The functional layer 43 provided so as to come into contact with the organic semiconductor layer 10 is composed of matrix polymers such as PMMA in which electron acceptors such as p-bromanil are contained.

6 Claims, 2 Drawing Sheets

FIELD-EFFECT TRANSISTOR

TECHNOICAL FIELD

The present invention relates to a field-effect transistor (FET) and, more particularly, to an FET comprising semiconductor layers containing organic substances.

BACKGROUND ART

Generally, in the case of a thin film organic FET using organic semiconductors, semiconductor layers can be formed by a simple process such as a printing method, a spray method, or an ink-jet method, therefore, the cost is considerably lower than that of an FET using inorganic semiconductors. Moreover, since there is a possibility that a light and thin integrated circuit having a large area may be formed easily, the application thereof to a liquid crystal display, an organic EL display, an IC card, etc., is expected.

Recently, the mobility of carrier of the organic semiconductor is increased and those having the mobility of carrier as high as that of the amorphous silicon have been found. The research on how to put to practical use an FET using organic semiconductors having such a high mobility is extensively being carried out. Specifically, organic materials that exhibit a high mobility and are currently available include pentacene, polyalkylthiophene, etc., as a result, a great progress in the development of the organic FETs has been found.

However, even though these materials are used, such a high mobility as that of the amorphous silicon can be obtained only when the materials are molecular substances and are used in the form of a single crystal. If the entire semiconductor layer is made up of a single crystal, it is extremely difficult to manufacture a large integrated circuit at a low cost. On the other hand, organic semiconductors made of polycrystalline and amorphous polymers cannot be put to practical use because of the mobility incommensurably lower than that of a single crystal due to, for example, the loss of scattered electrons at grain boundaries.

In order to solve these problems, a proposal is made in which the mobility of a sexithiophene evaporated film, which is an organic semiconductor layer, is increased by using cyanoethyl pullulan as a material for a gate insulation film in an FET structure (refer to Patent document 1).

Patent document 1: Japanese Patent No. 2984370

DISCLOSURE OF THE INVENTION

Problem to be solved by the invention

However, the cyanoethyl pullulan itself is so hygroscopic that an FET using the cyanoethyl pullulan has a problem in that the transistor characteristics may change by absorbing moisture. Moreover, the cyanoethyl pullulan is so soluble in organic solvents frequently used for manufacture of a thin film transistor, therefore, after a cyanoethyl pullulan film was formed as an insulation film, the process of photolithography or the cleaning process using such organic solvents cannot be carried out. In this case, it is practically impossible to make an FET into a more highly-integrated one.

When the inventors of the present invention examined in detail an FET using a cyanoethyl pullulan film as an insulation film, it was found that hysteresis was extremely large and the dielectric strength was not sufficient for practical use. From these results, it can be judged that the conventional FET using the cyanoethyl pullulan as it is cannot be put to practical use.

The above-mentioned problems being taken into consideration, the present invention has been developed and an object thereof is to provide an FET capable of exhibiting a sufficiently high mobility without the need to make a semiconductor layer into a single crystal and realizing an integrated circuit having excellent characteristics for practical use and a large area at a low cost.

Means for Solving Problem

In order to attain the above-mentioned object, the inventors of the present invention focused on and attentively examined the physical properties of a gate insulation film adjacent to a semiconductor layer. According to Patent document 1 described above, attention has been paid to the fact that the dielectric constant of cyanoethyl pullulan is high and it is estimated that the high dielectric constant increases the mobility in the vicinity of the boundary surface of the semiconductor layer. Therefore, barium titanate, which is widely known as a material having a high dielectric constant ($\epsilon=16$ when a film is formed by the sol-gel method), was used to form a gate insulation film. However, it was found that the mobility measured in the FET structure was increased by only about 20% compared to the FET having a normal structure in which the gate insulation film was made of $SiO_2$ ($\epsilon=3.9$). Judging from the fact that the mobility when cyanoethyl pullulan ($\epsilon=16$) is used for a gate insulation film is increased by a factor of 100 to 1,000 times, it can be thought that the dielectric constant of a gate insulation film does not affect the mobility.

As the movement of carriers is an electric behavior, it can be thought that a substance having a polar molecule, or part of which is polar, may affect the mobility of an FET. In order to confirm this, a polymer film having various polar groups was formed between an insulation layer and a semiconductor layer. The result was that not all kinds of polymer film necessarily increased the mobility. Because of this, the possibility that the function alone of a polar substance as an electric dipole may be the main factor affecting the mobility can be judged to be slight. However, it was found that some of the polymers used for the test increased the mobility of an FET significantly. The inventors have completed the present invention based on the acquired knowledge.

In other words, the FET according to the present invention is characterized by comprising a gate electrode formed at one side of a base substrate, a source electrode formed at one side of the base substrate, a drain electrode formed at one side of the base substrate, an insulation layer formed between the gate electrode and the source electrode and between the gate electrode and the drain electrode, a semiconductor layer formed around (at the periphery of) the source electrode and the drain electrode, and a functional layer provided so as to come into contact with the semiconductor layer and including electron acceptors.

The electron acceptor in the present invention is a substance including Lewis acid as an electron pair acceptor and having molecules, groups, or ions as its main component, which can receive electrons in the configuration interaction between a structure in which it is assumed that electrons move between electron-donator molecules and electron-acceptor molecules and a structure in which charges are not caused to move.

As described above, scattering of electrons, which is likely to occur at grain boundaries, and the loss caused by the scattering can be thought one of the factors that cause the mobility of an FET having a polycrystalline organic semiconductor layer to drop extremely. In contrast to this, in the FET having the above-mentioned configuration according to the present invention, even if the semiconductor layer is made of polycrystal, the electron acceptor contained in the functional layer provided so as to come into contact with the semiconductor layer takes out the electrons in the vicinity of the grain boundaries of the semiconductor layer and therefore it can be estimated that the occurrence of scattering of carriers at the grain boundaries is suppressed. However, the function is not limited to this.

It is preferable for the functional layer to have the electrically insulating properties and in this case, the functional layer may double as an insulation layer. However, as described above, the functional layer is thought to sufficiently function in the interaction between the electron acceptor and the crystal grains of the semiconductor layer at the boundary surface between the functional layer and the semiconductor layer. Therefore, the functional layer only needs to be provided in a state of being an extremely thin film and in this case, it is preferable to separately provide another insulation layer from the standpoint of enhancing the withstanding properties and preventing the current from leaking out. Moreover, the base substrate may be one that doubles as a gate electrode.

It is preferable for the electron acceptor to have a half-wave reduction potential being equal to or greater than −0.46 V or, much preferably, between −0.46 V and 0.15 V. The half-wave reduction potential is an electrochemical index used to measure and evaluate the electron affinity, and in the present invention, the half-wave reduction potential is measured in such a manner that a specimen to be measured is mixed in acetonitrile and a silver-silver chloride electrode is used as a reference electrode.

When the half-wave reduction potential is less than −0.46 V, it tends to become more difficult to obtain a sufficient drain current when the same gate voltage is applied to the FET. If the half-wave reduction potential exceeds 0.15 V, the drain current tends to increase more readily when the gate voltage is 0 V and there may be a case where it is difficult to satisfy a high ON/OFF ratio of a transistor when required.

More specifically, it is preferable for the electron acceptor to be a π-conjugate molecule composed of an ethylene molecule or a π-conjugate structure whose carbon number is 3 to 15 (integer) to which at least one of groups —CN, —NO$_2$, —F, —Cl, —Br, —I, and =O is linked.

In this manner, the electron acceptor can be realized, which functions to sufficiently pull out electrons from the boundary surface of a crystal making up a semiconductor layer by means of the electron attracting properties of the groups —CN, —NO$_2$, —F, —Cl, —Br, —I, and =O. If the carbon number of the π-conjugate structure exceeds 15, the energy difference between HOMO and LUMO tends to become extremely small and in such a case, a problem arises in that unwanted carriers are generated.

It is much preferable for the π-conjugate structure to have a carbon number of 3 to 15 (integer) and a heterocycle formed therein, including an S atom as a heteroatom. The heterocyclic structure includes a structure in which not only an S atom is contained as a heteroatom such as thiophene but another heteroatom such as thiazole is contained and a structure in which a heterocycle condensed with a homocycle or a heterocycle condensed with another heterocycle.

There is advantage in that the energy position of HOMO can be adjusted if an electron acceptor having a π-conjugate structure in which a heterocycle containing an S atom is formed is contained in the functional layer.

Moreover, it is preferable for the functional layer to have a thickness of 0.5 to 500 nm and, much preferably, a thickness of 0.5 to 100 nm. If the thickness is less than the lower limit, a problem arises in that the mobility is not increased. On the other hand, if the thickness exceeds the upper limit, the electrostatic capacitance between the functional layer and the insulation layer becomes extremely small, therefore, a higher gate voltage is required to form the channel layer.

If the relative relationship between the functional layer and the insulation layer is expressed definitely, it is also preferable for the functional layer to satisfy the relationship expressed by the following expression (1). In the expression, d1 denotes the thickness of the functional layer and d2 denotes the thickness of the insulation layer.

$$d2 \times 0.001 \leq d1 \leq d2 \times 1 \tag{1}$$

As described above, the functional layer may double as an insulation layer, but in such a case, the relationship expressed by the above expression will not impose any restriction.

Moreover, it is preferable that the concentration of electron acceptors contained in the functional layer be 0.01 to 10 mass %. If the concentration is less than 0.01 mass %, it tends to become difficult to increase the mobility of FET significantly. In contrast to this, if the concentration exceeds 10 mass %, the electron attracting properties are enhanced excessively depending on the type of electron acceptor, a considerable number of holes are produced in the semiconductor layer, and as a result, there is a possibility that the leak current may increase.

Effect of the Invention

As described above, the organic FET of the present invention comprises the functional layer containing electron acceptors, therefore, is capable of exhibiting a sufficiently high mobility without making the organic semiconductor layer into a single crystal and thanks to this, it is possible to realize a large integrated circuit having excellent characteristics for practical use at a low cost.

Figure 1:
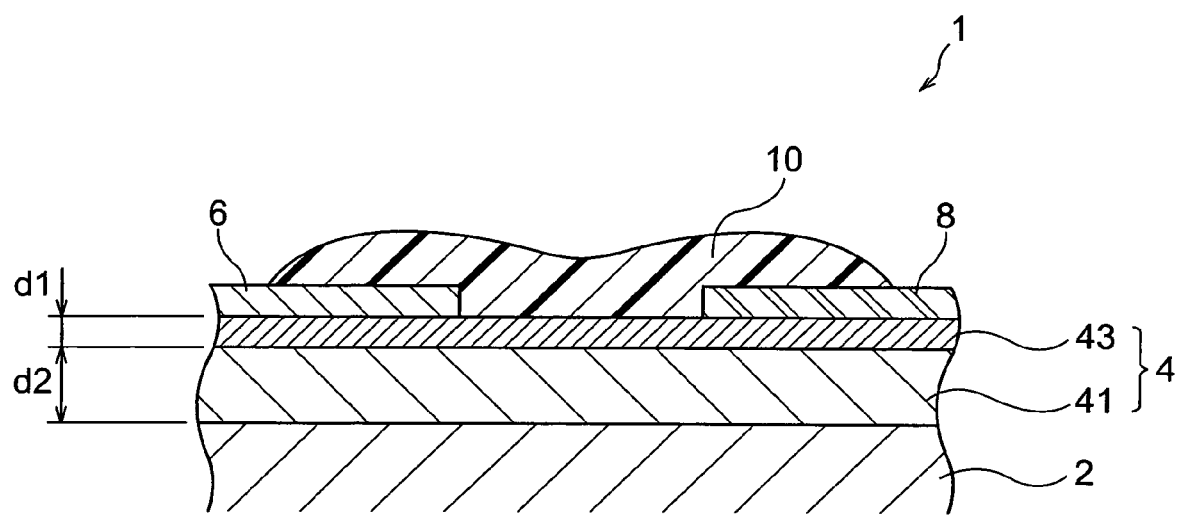
FIG. 1 is a sectional view schematically showing an important part in a configuration of an FET of the present invention.

EXPLANATION OF REFERENCE NUMERALS AND LETTERS 1 organic FET (FET)
2 substrate (base substrate, gate electrode)
4 composite insulation layer
6 source electrode
8 drain electrode
10 organic semiconductor layer (semiconductor layer)
41 gate insulation film (insulation layer)
43 functional layer
B grain boundary
C crystalline grain

BEST MODES FOR CARRYING OUT THE INVENTION

Embodiments of the present invention are explained in detail with reference to the drawings. The same letters and numerals are used for the same components and no duplicated explanation is given here. It is assumed that the positional relationship among upper, lower, right, and left parts corresponds to that shown in the drawings.

FIG. 1 is a sectional view schematically showing an important part in a configuration of an FET of the present invention. An organic FET 1 comprises a substrate 2 (base substrate) on which a gate insulation film 41 (insulation layer) made of an insulation material and a functional layer 43 are formed in this order, and a source electrode 6 and a drain electrode 8 are further arranged thereon at a predetermined distance from each other, and furthermore an organic semiconductor layer 10 (semiconductor layer) is formed on and between the electrodes 6 and 8. The functional layer 43 has the insulating properties and in this sense, the gate insulation film 41 and the functional layer 43 make up a composite insulation layer 4.

The arrangement of the organic semiconductor layer 10 is not limited to that shown schematically. For example, an organic FET having a structure, in which the organic semiconductor layer 10 is formed on the functional layer 43 and the source electrode 6 and the drain electrode 8 are formed on the organic semiconductor layer 10 at a predetermined distance from each other, is included in the FETs of the present invention.

The substrate 2 shown in FIG. 1 is made of a conductive material such as polysilicon or doped Si, and doubles as a gate electrode. However, a substrate having the insulating properties made of a material such as glass, ceramics, or plastic can be used and in such a case, it is necessary to provide a gate electrode separately in order to maintain the insulation among the source electrode 6, the drain electrode 8, and the organic semiconductor layer 10. Moreover, materials of the organic semiconductor layer 10 are not limited in particular provided the materials are organic substances having the semiconductor characteristic that can realize a channel structure, and for example, a polycyclic compound (acene) composed of four/five or more ortho condensed benzene rings in a linear arrangement such as pentacene or tetracene, polyalkylthiophene, thiophene oligomer, etc., can be used.

The gate insulation film 41 is made of various materials that exhibit a proper dielectric constant and specifically, the materials include an inorganic dielectric such as $SiO_2$, $Al_2O_3$, $Si_3N_4$, or $TiO_2$, an organic polymer such as polyimide, Mylar, polyvinylidene fluoride, polymethylmethacrylate, etc.

The functional layer 43 is prepared by solidifying a polymer, which is a matrix material (base material), in a state in which electron acceptors are dissolved, dispersed, or mixed therein. Polymers for the matrix material are not limited in particular provided electron acceptors can be easily dissolved, dispersed, or mixed therein, as will be described later, the polymers can be easily dissolved in solvents as the need arises, and the solution thereof can be easily applied, including, for example, an acrylic resin.

Preferably, acrylic resins are polymers of (meth)acrylic acid ester base monomers, or more specifically, polyalkyl (meth)acrylate such as polymethyl(meth)acrylate (PMMA), polyethyl(meth)acrylate, poly n-propyl (meth)acrylate, poly n-butyl(meth)acrylate, polyisobutyl(meth)acrylate, or poly tertiary butyl(meth)acrylate, multifunctional (meth)acrylate polymers, modified (meth)acrylate polymers, etc.

Resins other than the acrylic resins include, for example, copolymers of (meth)acrylic acid ester base monomer and monomer other than this, and more specifically, polymers of acrylamide group, polymers of aromatic vinyl compounds, etc. Moreover, examples include polyethylene terephthalate, polyethylene, polypropylene, polyvinyl chloride, various polyester carbonate groups, polyurethane group, epoxy resin group, etc.

Similarly, the electron acceptors are not limited in particular and it is preferable for the half-wave reduction potential to be equal to or greater than −0.46 V or, much preferably, between −0.46 V and 0.15 V. Specifically, it is preferable for the electron acceptor to be a π-conjugate molecule composed of an ethylene molecule or a π-conjugate structure (hetero cyclic structure can be contained in part) whose carbon number is 3 to 15 (integer), to which at least one group of —CN, —NO₂, —F, —Cl, —Br, —I, and =O is linked.

Specifically, the electron acceptors include tetracyanoethylene, tetracyanoquinodimethane, tetrafluorotetracyanoquinodimethane, tetracyanonaphthoquinodimethane, tetracyanoanthoraquinodimethane, 2,5-dimethyl-7,7,8,8-tetracyanoquinodimethane, 11,11,12,12-tetracyanonaphtho-2,6-quinodimethane, dicyanoquinodiimine, trinitrobenzen, trinitrofluorenone, o-bromanil, p-bromanil, o-chloranil, p-chloranil, p-benzoquinone, trichloro-p-benzoquinone, dichlorobenzoquinone, monochloro-p-benzoquinone, phenanthrenequinone, naphthoquinone, p-benzoquinone, etc.

It is much preferable to use an electron acceptor whose carbon number is 3 to 15 (integer) and in which a heterocycle including an S atom as a heteroatom is formed. Specific examples of the electron acceptor include the following compounds.

As a first specific example, it is preferable to use TCN-T1 expressed by the following chemical formula.

[Chemical formula 1]

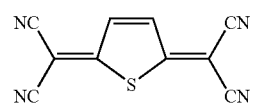

As a second specific example, it is also preferable to use TCN-T2 expressed by the following chemical formula.

[Chemical formula 2]

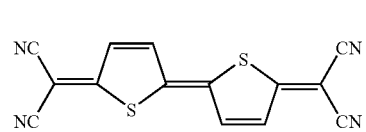

As a third specific example, it is also preferable to use TCN-T3 expressed by the following chemical formula.

[Chemical formula 3]

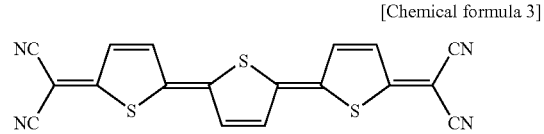

It is preferable for the concentration of electron acceptors contained in the functional layer 43 to be 0.01 to 10 mass % or, much preferably, 0.1 to 3 mass %. Moreover, although the thickness d1 (refer to FIG. 1) of the functional layer 43 is not limited, it is preferable for the thickness to be 10 to 3,000 nm or, much preferably, 100 to 1,000 nm.

The thickness d1 of the functional layer 43 may be designed according to circumstances based on the relationship with the thickness d2 of the gate insulation film 41. For example, it is preferable for the thickness d1 to satisfy the relationship expressed by the following expression (1).

$$d2 \times 0.001 \leq d1 \leq d2 \times 1 \quad (1)$$

It is also preferable to satisfy the relationship expressed by the following expression (2).

$$d2 \times 0.001 \leq d1 \leq d2 \leq 0.1 \quad (2)$$

An example of a procedure to manufacture the organic FET 1 configured as described above is explained below. First, an n-type silicon substrate (for example, bulk resistivity is about 10 Ωcm) is prepared as the substrate 2, and the substrate 2 is thermally oxidized according to circumstances to form the gate insulation film 41 composed of a thermally-oxidized film ($SiO_2$ film) having a thickness of about 200 nm.

Next, a solution is prepared, which is an organic solvent in which the polymers for the matrix material and the electron acceptors describe above are dissolved. Organic solvents are not limited in particular provided the polymers and the electron acceptors can be readily dissolved and dispersed therein. For example, the alcohol group, the ether group, the ketone group, the ester group, the glycol ether group, aromatic compounds, petroleum ether, etc., and according to circumstances, monomers of the same kind of polymer, for example, (meth)acrylic acid ester group, aromatic vinyl compounds, etc, can be used.

Next, the solution is applied onto the gate insulation film 41 of the substrate 2 by an application method such as a spin-coating, roll-coating, die-coating, bar-coating, or dip-coating. Then, the solvent contained in the solution-applied film is evaporated for removal by drying under reduced pressure to form the functional layer 43. Further, the source electrode 6 and the drain electrode 8 are formed by vapor deposition of a metal such as Au. After this, the material of the above-mentioned organic semiconductor layer 10 is evaporated onto the periphery of both the electrodes 6 and 8 by vapor deposition etc. so that the thickness is about 50 nm, and thus the organic semiconductor layer 10 is formed and the organic FET 1 is obtained. Here, the channel length is set to about 20 μm and the channel width to about 5 mm.

In order to manufacture the organic FET 1 having the above-mentioned configuration in which the organic semiconductor layer 10 is provided on the functional layer 43 and the source electrode 6 and the drain electrode 8 are formed thereon, after the functional layer 43 is formed by application of solution and drying, the organic semiconductor layer 10 is evaporated and both the electrodes 6 and 8 are formed thereon by metal evaporation.

According to the organic FET 1 thus configured, even if the organic semiconductor layer 10 is composed of polycrystal, the electron acceptors contained in the functional layer 43 provided in such a manner as to be evaporated thereto can interact with the organic semiconductor layer 10 so as to pull out or take out the electrons in the vicinity of the grain boundaries of the organic semiconductor layer 10.

Figure 2:
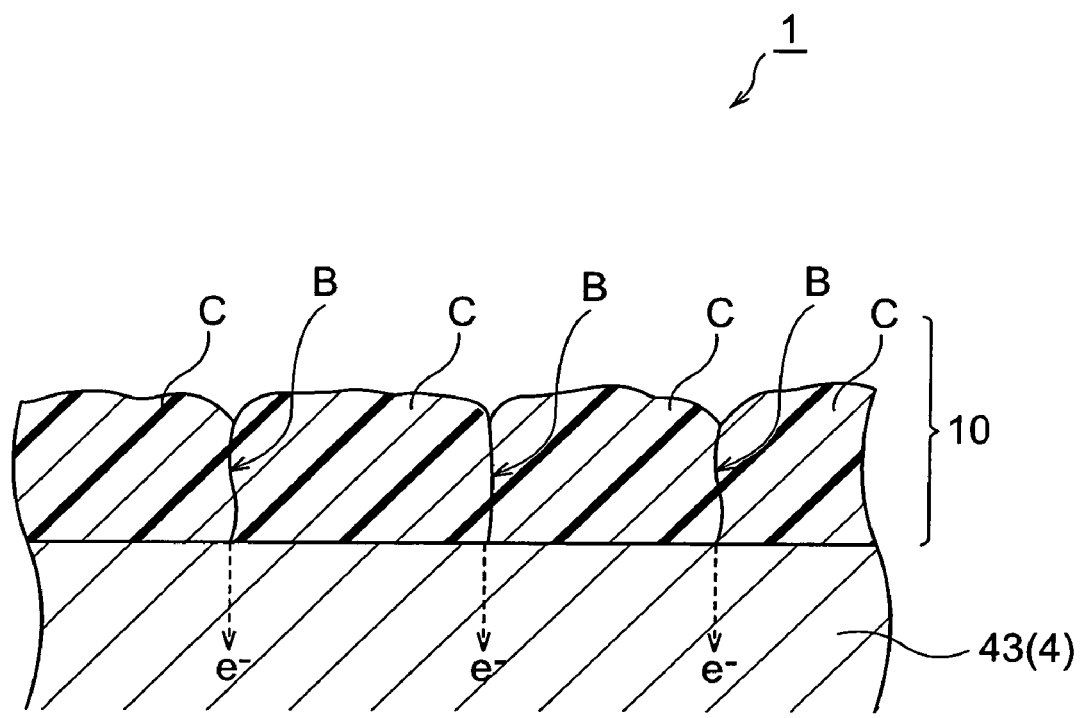
FIG. 2 is a sectional view schematically showing the state in the vicinity of a boundary surface between an organic semiconductor layer 10 and a functional layer 43 in an organic FET 1.

FIG. 2 is a sectional view schematically showing the state in the vicinity of the boundary surface between the organic semiconductor layer 10 and the functional layer 43 in the organic FET 1. The organic semiconductor layer 10 tends to turn into a polycrystalline state in such a manner that crystalline grains C that occupy a certain region are arranged additionally during the period of crystal growth by, for example, vapor deposition. As described above, conventionally, the holes as carriers are readily scattered at grain boundaries B. However, in contrast to this, in the organic FET 1, the electron acceptors contained in the functional layer 43 pull in the electrons in the vicinity of the grain boundaries B and it is estimated that the functional layer 43 functions so as to contain these electrons. However, the function is not limited to this.

As a result, the electrons can be prevented from being scattered at the grain boundaries B and the leak current in a state in which the gate voltage is applied and the organic FET 1 turns on can be reduced considerably. In other words, because of the presence of the functional layer 43 containing the electron acceptors, the mobility of the organic FET 1 is increased significantly. Moreover, no problem arises even if the organic semiconductor layer 10 has turned into a polycrystalline state as described above, therefore, the man-hours and the cost can be saved because it is no longer necessary to purify the material of the organic semiconductor layer 10 to an extreme level.

Moreover, as the hygroscopicity itself of the functional layer 43 described above, in which the electron acceptors are contained in the matrix polymer, can be kept low, the response characteristic of the organic FET 1 can be prevented sufficiently from changing. Unlike the conventional case where a cyanoethyl pullulan film is used as an insulation film, it is possible to make the functional layer 43 into one having a lower solubility for organic solvents frequently used for manufacture of thin film transistors, and the process of photolithography and the cleaning process using such organic solvents can be applied. Moreover, the organic FET 1 keeps hysteresis low and has the advantage of being capable of enhancing the dielectric strength even when used in combination with the gate insulation film 41 or when the functional layer 43 is used alone.

If a substance having a half-wave reduction potential of −0.46 V or higher is used as the electron acceptor contained in the functional layer 43, it tends to become easier to obtain a sufficient amount of drain current when the same gate voltage is applied to an FET. If a substance having a half-wave reduction potential of 0.15 V or lower is used, it is possible to prevent the drain current in a state in which the gate voltage is 0 V from increasing. Therefore, even when a high ON/OFF ratio is demanded for a transistor, the demand can be satisfied sufficiently.

Moreover, if a π-conjugate molecule composed of an ethylene molecule or a π-conjugate structure whose carbon number is 3 to 15 (integer), to which at least one group of —CN, —$NO_2$, —F, —Cl, —Br, —I, and =O is linked, is used as the electron acceptor, it becomes more surely and easily to confer the electron accepting properties having the above-mentioned function on the functional layer 43. In this case, as the carbon number is 15 or less, there is advantage that the occurrence of carrier can be suppressed.

It is much preferable to use a π-conjugate structure whose carbon number is 3 to 15 (integer) and in which a heterocycle including an S atom as a heteroatom is formed because it becomes more easily to adjust the HOMO level.

When the thickness of the functional layer 43 is set to a value equal to the lower limit value or more described above, there is advantage that the functional layer 43 can be formed evenly. Moreover, when the thickness of the functional layer 43 is set to a value equal to the upper limit value or less described above, there is advantage that the electrostatic capacitance of the gate insulation film can be increased sufficiently.

When the functional layer 43 is configured so that the thickness thereof satisfies the relationship expressed by the expression (1), as the thickness is set to a value equal to the lower limit value or more in the expression (1), there is advantage that the effect of the functional layer can be exhibited effectively. On the other hand, if set to a value equal to the upper limit value or less in the expression (1), there is advantage that the withstand voltage can be increased.

If the concentration of the electron acceptors contained in the functional layer 43 is set to a value equal to or greater than 0.01 mass %, it becomes easier to confer the effect that can sufficiently increase the mobility of the organic FET 1 describe above on the functional layer 43. On the other hand, if the concentration is set to a value equal to or less than 10 mass %, it is possible to sufficiently prevent the generation of holes and, as a result, an increase in leak current, which would be caused when the electron attracting properties is excessively enhanced depending on the kind of electron acceptor.

EXAMPLES

Examples of the present invention are explained in detail below, however, the present invention is not limited to these examples.

Example 1

First, a highly-doped n-type silicon (bulk resistivity: 10 Ωcm) substrate that doubles as a gate electrode is prepared, on which a thermally-oxidized film having a thickness of about 200 nm is formed as a gate insulation film, and is cut into a 25 mm by 10 mm rectangle. On the other hand, 0.30 g of polymethyl methacrylate (PMMA) and 0.03 g of p-bromanil, which is an electron acceptor, are dissolved in 10 g of ethyl acetate and thus an application solution for a functional layer is prepared. The application solution is applied onto the above-described silicon substrate chip by spin-coating and the ethyl acetate in the solution-applied film is evaporated for removal by vacuum drying to form a functional layer having a thickness of 100 nm.

Next, pentacene, which is a material for an organic semiconductor layer, is evaporated onto the functional layer at a film forming rate of 0.1 nm/sec to form an organic semiconductor layer having a thickness of about 50 nm. Moreover, an Au film having a thickness of about 100 nm is evaporated thereon to form a source electrode and a drain electrode, and thus an organic FET is obtained. Here, the channel length is set to 20 μm and the channel width to 5 mm. The concentration of p-bromanil, which is the electron acceptor contained in the functional layer, is 10 mass % and the half-wave reduction potential of the p-bromanil is −0.1 to +0.2 V.

Example 2

An organic FET is obtained in the same manner as that in the example 1 except in that 0.01 g of tetracyanoquinodimethane, which is an electron acceptor, is used instead of p-bromanil. The concentration of tetracyanoquinodimethane contained in the functional layer is 3.3 mass % and the half-wave reduction potential of tetracyanoquinodimethane is +0.22 V.

Example 3

An organic FET is obtained in the same manner as that in the example 1 except in that 0.01 g of tetracyanonaphthoquinodimethane, which is an electron acceptor, is used instead of p-bromanil. The concentration of tetracyanonaphthoquinodimethane contained in the functional layer is 3.3 mass % and the half-wave reduction potential of tetracyanonaphthoquinodimethane is +0.26 V.

Example 4

An organic FET is obtained in the same manner as that in the example 1 except in that 0.01 g of 2,5-dimethyl-7,7,8,8-tetracyanoquinodimethane, which is an electron acceptor, is used instead of p-bromanil. The concentration of 2,5-dimethyl-7,7,8,8-tetracyanoquinodimethane contained in the functional layer is 3.3 mass % and the half-wave reduction potential of 2,5-dimethyl-7,7,8,8-tetracyanoquinodimethane is +0.15 V.

Example 5

An organic FET is obtained in the same manner as that in the example 1 except in that 0.03 g of p-chloranil, which is an electron acceptor, is used instead of p-bromanil. The concentration of p-chloranil contained in the functional layer is 10 mass % and the half-wave reduction potential of p-chloranil is +0.05 V.

Example 6

An organic FET is obtained in the same manner as that in the example 1 except in that 0.03 g of p-benzoquinone, which is an electron acceptor, is used instead of p-bromanil. The concentration of p-benzoquinone contained in the functional layer is 10 mass % and the half-wave reduction potential of p-benzoquinone is −0.46 V.

Comparative Example 1

An organic FET is obtained in the same manner as that in the example 1 except in that an application solution is prepared without the use of p-bromanil, that is, a film composed of only polymethacrylate, not including an electron acceptor, is formed on a gate insulation film.

Comparative Example 2

An organic FET is obtained in the same manner as that in the example 1 except in that a layer instead of a functional layer is formed using 0.03 g of p-phenylenediamine, which is an electron donor, instead of p-bromanil. The concentration of p-phenylenediamine contained in the layer is 10 mass %.

Comparative Example 3

An organic FET is obtained in the same manner as that in the example 1 except in that a functional layer is not provided.

<Characteristic Evaluation>

The change of the drain current versus the gate voltage is measured for each organic FET manufactured in the examples 1 to 6 and comparative examples 1 to 3, and the mobility in the FET structure is evaluated. The results are shown in Table 1.

TABLE 1

| Organic FET | Functional layer (matrix: PMMA) | | Mobility ($cm^2/V \cdot sec$) | Half-wave reduction potential (V) |
|---|---|---|---|---|
| | Additive substances | Electrochemical properties | | |
| Example 1 | p-bromanil | Electron accepting properties | $1.0 \times 10^{-1}$ | $-0.1 \sim +0.2$ |
| Example 2 | Tetracyanoquinodimethane | | — | $+0.22$ |
| Example 3 | Tetracyanonaphthoquinodimethane | | $2.0 \times 10^{-2}$ | $+0.26$ |
| Example 4 | 2,5-dimethyl-7,7,8,8-tetracyanoquinodimethane | | — | $+0.15$ |
| Example 5 | p-chloranil | | $1.0 \times 10^{-1}$ | $+0.05$ |
| Example 6 | p-benzoquinone | | $2.5 \times 10^{-2}$ | $-0.46$ |
| Comparative example 1 | No additive substance | | $6.2 \times 10^{-3}$ | — |
| Comparative example 2 | p-phenylenediamine | Electron donating properties | $5.1 \times 10^{-5}$ | — |
| Comparative example 3 | No functional layer | | $1.0 \times 10^{-2}$ | — |

From the comparison between the examples 1 and 3 and the comparative examples 1 and 3, it is found that the mobility of the organic FET of the present invention having a functional layer including electron acceptors is increased significantly compared to that of the organic FET in the comparative examples, not having such a functional layer. Moreover, from the comparison between the examples 1 and 3 and the comparative example 2, it is found that the electron acceptor has superiority over other polar additive substances.

In the examples 2 and 4, as a significant drain current was observed in a state in which the gate voltage was 0, the mobility is omitted. It is estimated that one of factors for such a drain current is that the electron acceptor used in the examples 2 and 4 has the comparatively enhanced electron attracting properties and with the above-mentioned concentration in the functional layer, conceptionally speaking, electrons not only in the vicinity of the grain boundaries of the organic semiconductor layer but also inside the crystal grains are pulled out excessively, therefore, an excessive number of holes are formed in the organic semiconductor layer and the amount of remaining carriers is increased undesirably. However, the function is not limited to this. In other words, it can be thought that this result suggests that it is useful to control the concentration of electron acceptors in the functional layer depending on the structure of an organic FET and the kind of electron acceptor (how likely it is to attract electrons)

INDUSTRIAL APPLICABILITY

The present invention can be used for a field-effect transistor (FET) and, more particularly, an FET comprising a semiconductor layer containing organic substances.

What is claimed is:

1. A field-effect transistor comprising:
a gate electrode formed at one side of a base substrate;
a source electrode formed at the one side of the base substrate;
a drain electrode formed at the one side of the base substrate;
an insulation layer formed between the gate electrode and the source electrode and between the gate electrode and the drain electrode;
a semiconductor layer formed around the source electrode and the drain electrode; and
a functional layer provided so as to come into contact with the semiconductor layer and containing electron acceptors, said functional layer being arranged between said semiconductor layer and said insulating layer,
wherein the electron acceptor is a π-conjugate molecule composed of an ethylene molecule or a π-conjugate structure whose carbon number is 3 to 15 to which at least one group of —CN, —NO$_2$, —F, —Cl, —Br, —I, and =O is linked.

2. The field-effect transistor according to claim 1, wherein the electron acceptor has a half-wave reduction potential of −0.46 V or higher.

3. The field-effect transistor according to claim 1, wherein the π-conjugate structure has a carbon number of 3 to 15 and in which a heterocycle including an S atom as a heteroatom is formed.

4. The field-effect transistor according to claim 1, wherein the thickness of the functional layer is 0.5 to 500 nm.

5. The field-effect transistor according to claim 1, wherein the functional layer satisfies the following expression (1);

$$d2 \times 0.001 \leq d1 \leq d2 \times 1 \quad (1)$$

where d1 denotes the thickness of the functional layer and d2 denotes the thickness of the insulation layer.

6. A field-effect transistor comprising:
a gate electrode formed at one side of a base substrate;
a source electrode formed at the one side of the base substrate;
a drain electrode formed at the one side of the base substrate;
an insulation layer formed between the gate electrode and the source electrode and between the gate electrode and the drain electrode;
a semiconductor layer formed around the source electrode and the drain electrode; and
a functional layer provided so as to come into contact with the semiconductor layer and containing electron acceptors, wherein the concentration of the electron acceptors contained in the functional layer is 0.01 to 10 mass %, and the electron acceptors are π-conjugate molecules, wherein each π-conjugate molecule is composed of an ethylene molecule or a π-conjugate structure whose carbon number is 3 to 15.

* * * * *